United States Patent [19]

Moline

[11] Patent Number: 5,075,759
[45] Date of Patent: Dec. 24, 1991

[54] SURFACE MOUNTING SEMICONDUCTOR DEVICE AND METHOD

[75] Inventor: Daniel D. Moline, Kuala Lumpur, Malaysia

[73] Assignee: Motorola, Inc., Schaumburg, Ill.

[21] Appl. No.: 587,498

[22] Filed: Sep. 24, 1990

Related U.S. Application Data

[63] Continuation of Ser. No. 382,930, Jul. 21, 1989, abandoned.

[51] Int. Cl.⁵ .................. H01L 23/48; H01L 29/44; H01L 29/52; H01L 23/02
[52] U.S. Cl. ........................ 357/70; 357/74; 357/81; 361/421
[58] Field of Search ............... 361/421, 386, 388; 357/74, 81, 70

[56] References Cited

U.S. PATENT DOCUMENTS

| | | | |
|---|---|---|---|
| 3,374,534 | 3/1965 | Doelp | 361/421 |
| 3,480,836 | 8/1966 | Aronstein | 29/626 |
| 3,549,782 | 12/1970 | Reifel | 174/52 |
| 4,472,762 | 9/1984 | Spinelli et al. | 361/386 |
| 4,509,096 | 4/1985 | Baldwin et al. | 361/386 |
| 4,541,003 | 9/1985 | Otsuka | 357/74 |
| 4,554,613 | 11/1985 | Kaufman | 361/386 |
| 4,630,174 | 12/1986 | Kaufman | 361/388 |
| 4,724,514 | 2/1988 | Kaufman | 361/388 |
| 4,814,943 | 3/1989 | Okuaki | 361/400 |
| 4,843,036 | 6/1989 | Schmidt et al. | 437/224 |
| 4,866,506 | 9/1989 | Nambu et al. | 357/72 |

FOREIGN PATENT DOCUMENTS

| | | | |
|---|---|---|---|
| 2514011 | 10/1976 | Fed. Rep. of Germany | 357/70 |
| 59-036955 | 2/1984 | Japan | 357/70 |
| 62-037955 | 2/1987 | Japan | 357/70 |
| 01-125999 | 5/1989 | Japan | 361/386 |

Primary Examiner—Andrew J. James
Assistant Examiner—Stephen D. Meier
Attorney, Agent, or Firm—Joe E. Barbee; Robert M. Handy

[57] ABSTRACT

A surface mounting device incorporating a high power RF semiconductor transistor comprises a common lead plane, an input lead plane, a collector lead plane, a transistor die electrically and thermally connected to the collector lead plane, bonding wires for connecting emitters and bases of the transistor to the common and input lead planes respectively, and a molded plastic body member for sealing the device components while leaving the lower coplanar surfaces of the lead planes exposed on the bottom face of the device. There are no flying leads. By eliminating an expensive metallized ceramic insulator from inside the device package and instead providing electrical isolation as a part of an external circuit board, the cost for fabricating the device and installing them on the printed circuit board are significantly reduced. The device is particularly rugged and can be easily mounted on the PC board by automated equipment.

14 Claims, 3 Drawing Sheets

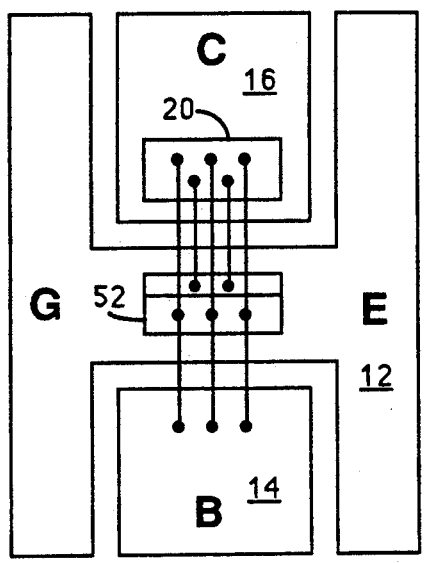 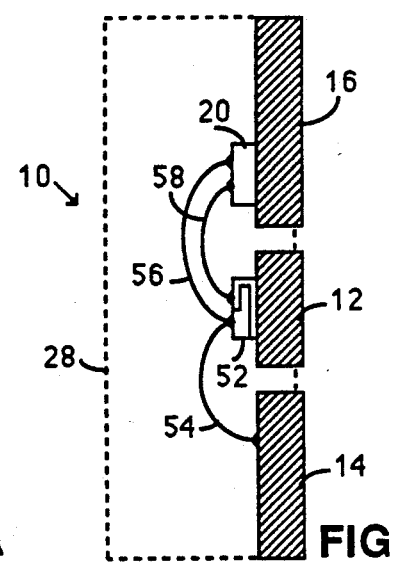
FIG. 6A  FIG. 6B
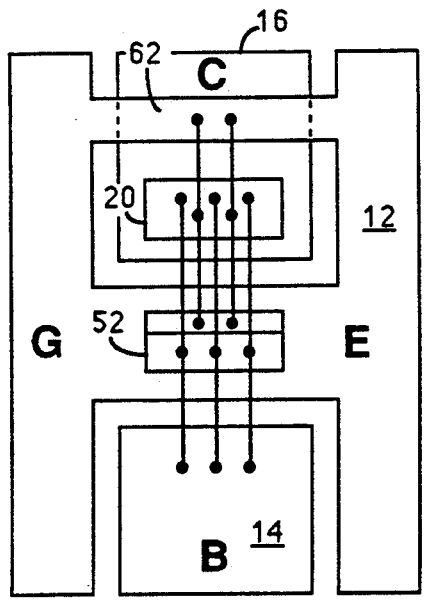 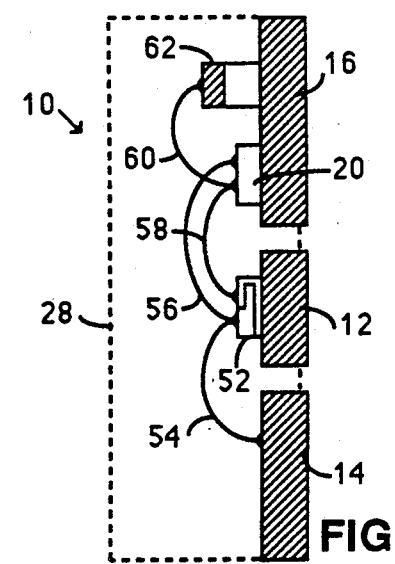
FIG. 7A  FIG. 7B
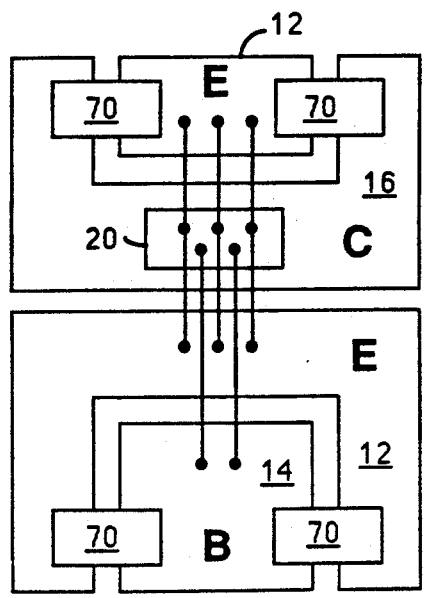 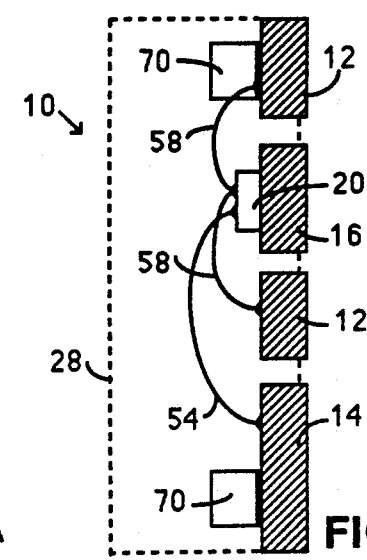
FIG. 8A  FIG. 8B

SURFACE MOUNTING SEMICONDUCTOR DEVICE AND METHOD

This application is a continuation of prior application Ser. No. 07/382,930 filed July 21, 1989 now abandoned.

FIELD OF THE INVENTION

The present invention relates, in general, to a surface mounting packaged semiconductor device and, more particularly, to a surface mounting device without an internal insulator under the active element, and a fabrication method therefor.

BACKGROUND OF THE INVENTION

With the increasing use of high power transistors (1 to 80 Watts) in electrical circuits which operate at high frequencies, such as radio frequencies (RF), e.g. 25 MHz to 1GHz, it has become necessary to design transistor packages which permit the transistors to operate properly in such circuits. The packages for such high power transistors must be capable of dissipating the relatively high quantities of heat generated by the transistor to maintain the transistor at a suitable operating temperature, i.e., a temperature which will not adversely affect the operating characteristics of the transistor. Another important characteristic for such packages is that they provide for good electrical grounding of the transistor with a minimum of parasitic inductance.

In order to satisfy these requirements and provide collector isolation, prior art high frequency semiconductor device packages for many high frequency transistors utilize internal metallized ceramic insulators. The metallization provides electrical connection to the transistor while the ceramic provide electrical isolation but thermal conduction between, typically, the transistor collector and the underlying heat sink on which the device is ultimately mounted.

For example, U.S. Pat. No. 3,969,752 discloses a semiconductor device package having a metal layer for supporting the bottom of an NPN transistor die and connecting to the transistor, collector, and having a ceramic insulator underlying the collector metal layer and overlying the lowest metal layer functioning as a ground terminal and as a heat sink. The bottom of the transistor die is the collector. This is because a top collector transistor configuration causes large parasitics. However, the collector must be separated from the common or ground terminal which is usually connected to the emitter. Therefore, electrical isolation of the bottom of the transistor from the ground is needed. Another U.S. Pat. No. 3,728,589 describes a semiconductor assembly having a mounting block of an electrical insulating but thermally conducting material, such as beryllium oxide or alumina, mounted in a cavity in a ground plane member.

Although the heat dissipation and the electrical parasitic characteristics of RF transistor device packages have been improved in the prior art, they require additional materials and processes for introducing metallized ceramics, which are time and cost consuming. Insulating BeO and $Al_2O_2$ ceramics 40 to 60 mils thick, such as are commonly used in the prior art, are expensive. Further, the ceramic must be metallized, with e.g. gold, and then usually brazed or soldered to other package components. As a result, the final package cost including the cost of the ceramic material, the metallization, brazing or soldering, and the heat sink becomes quite high.

In addition, some prior art semiconductor device packages are prone to have flux and solder enter the cavity of the device, for example, during soldering operations used to attach the packages to the circuit. Further, most prior art RF packages are not well suited for surface mounting and are not designed to be easily handled by pick and place equipment. Also, positioning of capacitors close to most prior art packages is often difficult because of the protruding flying leads found on these packages.

SUMMARY OF THE INVENTION

Accordingly, it is an object of the present invention to provide an improved surface mounting semiconductor device and method, therefore including for example a high power transistor adapted for high frequency operation, wherein the cost and time required for fabricating the device are reduced. More particularly, it is an object of the present invention to provide such a surface mounting semiconductor device and fabricating method thereof, without using an internal insulator under the active element.

Yet another object of the present invention is to provide an improved electronic assembly including such device and a mating printed circuit board having an electrically insulated heat sink, wherein the total cost is reduced.

In carrying out the above and other objects of the invention, there is provided in an exemplary embodiment employing a transistor, a surface mounting package for a high power semiconductor device comprising a common lead plane, an input lead plane, a collector lead plane, a transistor die mounted on the collector lead plane, bonding wires for connecting emitter(s) and base(s) of the transistor to the common and input lead planes respectively, and an enclosure for sealing the package components. By removing the expensive metallized ceramic insulator from within the device package and instead forming the collector isolation insulator as a part of a printed circuit board or as an insert in the circuit board, the cost of fabricating the device package is significantly reduced. Further, the device of the present invention can be conveniently handled by pick and place equipment because it need not have flying leads typical of prior art dual-in-line or gull-wing or SOT type packages.

In accordance with another feature of the present invention, there is also provided an electronic assembly comprising such device and a printed circuit board. For the situation where the device comprises a transistor, the printed circuit board has a board member of insulating material, a common contact, an input contact and an output contact on the board member, and a thermally conductive region extending through the board member whose upper surface is desirably coplanar with the upper surface of the contacts. The device package is mounted on the printed circuit board so that the common, input and a first portion of the collector lead planes are in contact with the common, input and output contacts respectively, and another portion of the collector lead plane is in contact with the heat sink region. Because the heat sink member need incorporate only a very thin electrical insulator, and because it can be placed in or on the printed circuit board without need of metallizing or, alternatively, provided as a separate part, the required processes and the total cost for making such electric circuit (including the device, the printed circuit board and the heat sink member) is reduced.

These and other objects and advantages will be apparent to one of skill in the art from the detailed description below taken together with the drawings.

BRIEF DESCRIPTION OF THE DRAWINGS

FIGS. 6A, 7A and 8A are simplified plan views of various lead planes with transistor die thereon, according to still further embodiments of the present invention; and FIGS. 6B, 7B and 8B are simplified central cross-sections of FIGS. 6A-8A, respectively.

DETAILED DESCRIPTION OF THE INVENTION

Figure 3A:
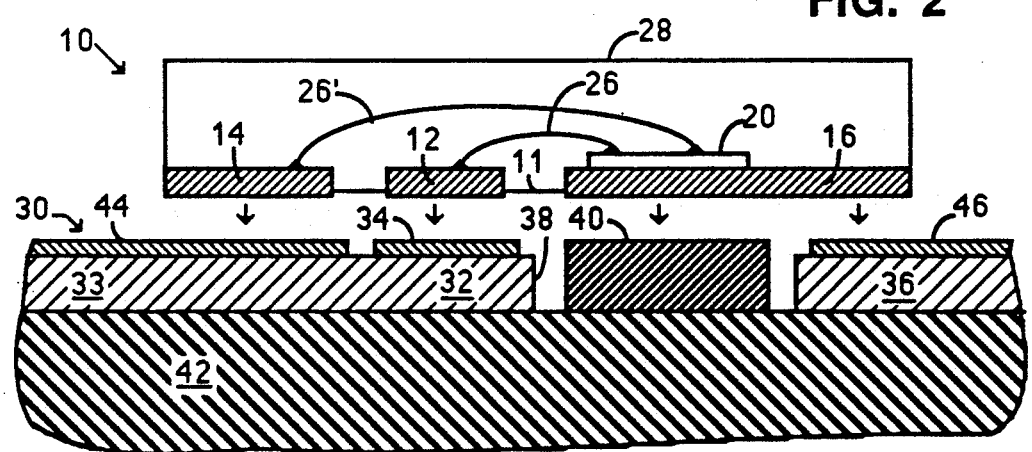
FIG. 3A is a cross-sectional view of the device shown in FIG. 1 and a printed circuit board containing a heat sink insulator, illustrating the contacting relationship between the device and the printed circuit board.
Figure 4:
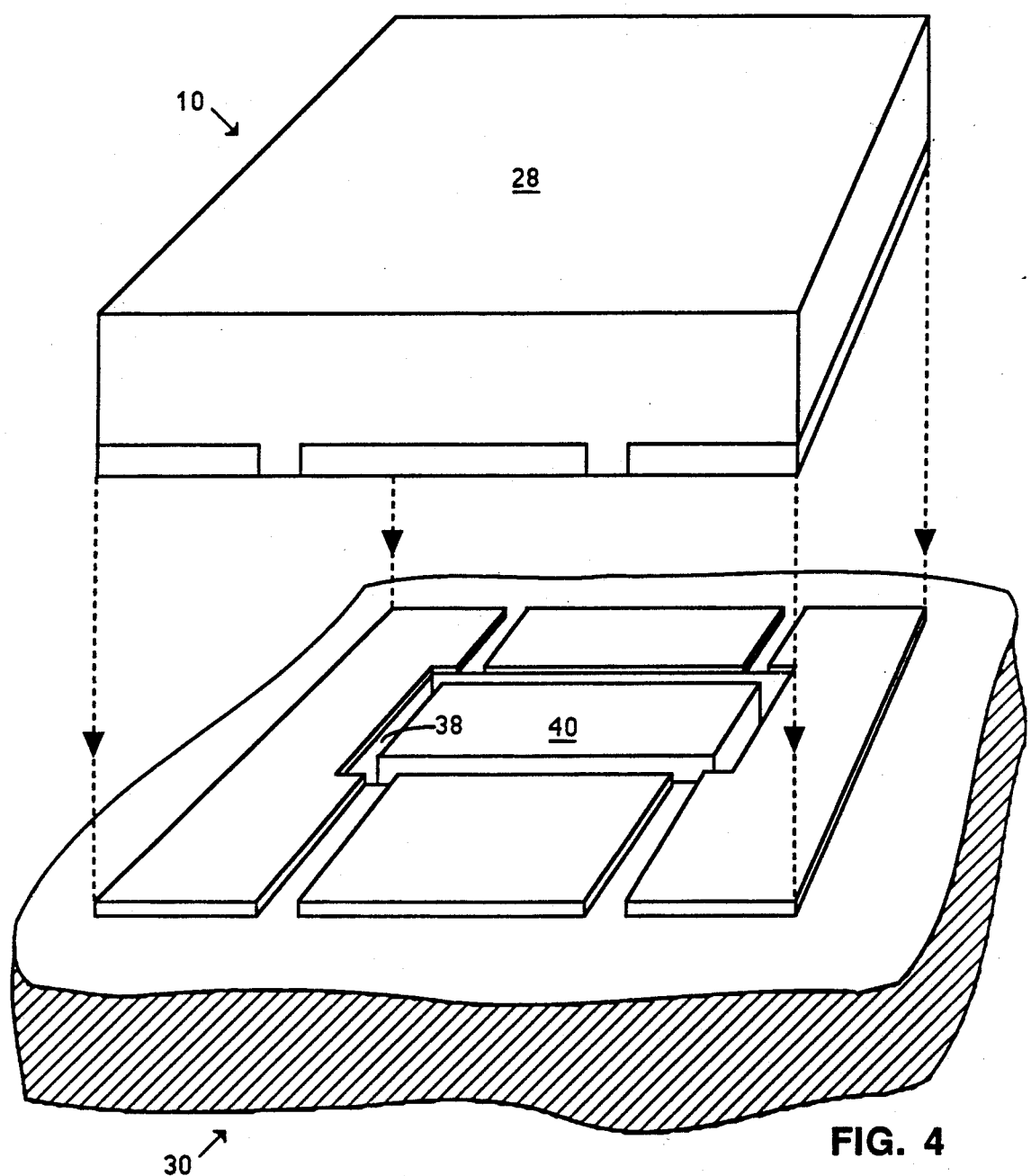
FIG. 4 is a perspective view of a printed circuit board and device similar to that shown in FIG. 3A but according to a further embodiment of the present invention.
Figure 5:
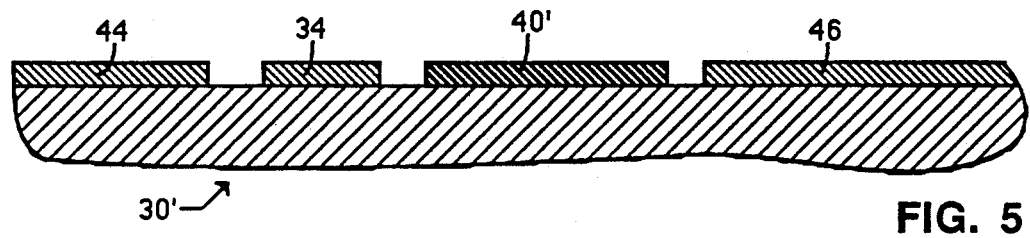
FIG. 5 is a cross-sectional view of an additional embodiment of a printed circuit board similar to that shown in FIG. 3A.

A semiconductor device suitable for mounting to a mating printed circuit board, according to the present invention, will now be described in detail with reference to a preferred embodiment thereof, illustrated in FIGS. 1, 2 and 3. Alternative configurations are illustrated in FIGS. 4-6. The present invention is useful for discrete transistors and ICs and is especially well suited to RF power devices and circuits.

For convenience of explanation and not intended to be limiting, the package and circuit arrangement is described herein in terms of a bipolar transistor having emitter, base and collector terminals. However, those of skill in the art will understand that the present invention also applies to other electronic elements, such as for example, field effect transistors, thyristors, diodes, phototransistors, and other elements familiar to those of skill in the art. As used herein, the words "transistor" or "transistors" are intended to include such other elements and the words "emitter", "base", and/or "collector" are intended to include analogous terminals of such other elements.

Referring now to FIGS. 1-3A, surface mountable electronic device 10 includes substantially flat common lead plane 12 exposed on lower face 11 of device 10 and having upper and lower surfaces. Common lead plane 12 comprises in the illustrated embodiment, two parallel side portions 12″ joined by bridge portion 12′, and is made of an electrically conductive material, such as copper.

Device 10 also includes input lead plane 14 whose lower surface is also exposed on lower surface 11 of device 10. Input lead plane 14 is, preferably, a flat rectangular electrode having upper and lower surfaces, and is made of an electrically conductive material, such as copper. However, common and input lead planes 12 and 14 may be made of other materials covered with an electrically conducting material.

Device 10 further includes collector lead plane 16 whose lower surface is also exposed on lower surface 11 of device 10 in the same manner as lead planes 12, 14. Collector lead plane 16 is, preferably, a flat rectangular electrode having upper and lower surfaces and, desirably, has an area which is large compared to transistor die 20. Collector lead plane 16 is made of an electrically and thermally conductive material, such as copper. However, collector lead plane 16 may be made of a good thermally conductive material which is coated with an electrically conductive layer.

The lower surfaces of lead planes 12, 14 and 16 are substantially coplanar and are exposed on or slightly protrude from surface 11 of device 10. For manufacturing convenience, leads 12, 14 and 16 may be part of a planar "ladder" lead-frame with detachable side-rails 13 and support strips visible in FIG. 2, which are sheared off after encapsulation. While leads 12 14, 16 are shown as having a shape that is rectangular or a combination of joined rectangles and as having the same thickness, they may have any convenient lateral shape and variable thickness. It is important however that their lower surfaces be substantially flat and coplanar.

Transistor die 20 is generally a flat body of semiconductor material, such as for example a silicon chip having several bipolar transistor cells or other device regions formed therein. The number of cells and type of transistor or other element will vary with particular applications. For example, RF transistors having from 1 to 40 NPN amplifying cells are commonly used. Such devices are constructed by means well known in the art. Multiple parallel wire bonds are typically used to connect the device regions of the cells to the package leads.

Transistor die 20 is mechanically secured to the upper surface of collector lead plane 16 by any convenient method, such as for example, bonding with Au-Ge or Au-Si eutectic or other suitable electrically and thermally conductive attachment material. Thus, the lower surface of transistor die 20 is electrically and thermally coupled to the upper surface of collector lead plane 16. In the embodiment shown in FIGS. 1-2, four transistor cells are illustrated, i.e., four emitter electrode regions 24 and four base electrode regions 22 are provided on the upper surface of transistor die 20. A collector electrode region (not shown) is provided on the lower surface of transistor die 20, and is electrically and thermally coupled to the upper surface of collector lead plane 16. Transistor die 20 is generally smaller in area than the upper surface of collector lead plane 16.

Although transistor die 20 is shown as being positioned adjacent one edge of collector lead plane 16, it may be placed anywhere on the upper surface of collector lead plane 16. Further, while die 20 is referred to for convenience as a transistor, it may be any electronic element having at least two terminals, wherein the surface bonded to lead 16 is the principal heat dissipating surface.

Where the transistor contained within package 10 is to be used in the common emitter configuration, which is typical in RF amplifiers, emitter contact regions 24 of transistor die 20 are electrically connected to the upper surface of bridge portion 12′ of common lead plane 12 by a plurality of bonding wires 26. Wires 26 are of an electrically conductive metal, such as gold or aluminum. Wires 26 are bonded preferably by either ultrasonic or compression bonding techniques.

Base contact regions 22 of transistor die 20 are electrically connected to the upper surface of input lead plane 14 by a plurality of bonding wires 26' similar to wires 26. While gold and aluminum wire are particularly convenient for connections 26, 26', other interconnection means well known in the art may also be used. As used herein the words "bonding wires" are intended to refer generally to any means of interconnecting the wire bonding pads or attachment points on the semiconductor die to the appropriate regions on the lead planes.

Figure 1:
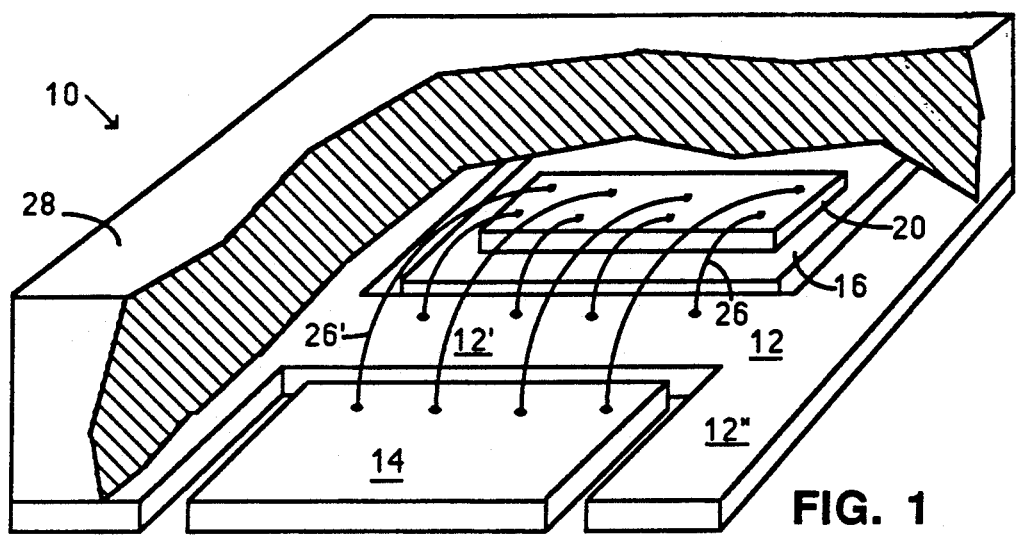
FIG. 1 is a partially cut away and perspective view illustrating a surface mounting electronic device according to one embodiment of the present invention.
Figure 2:
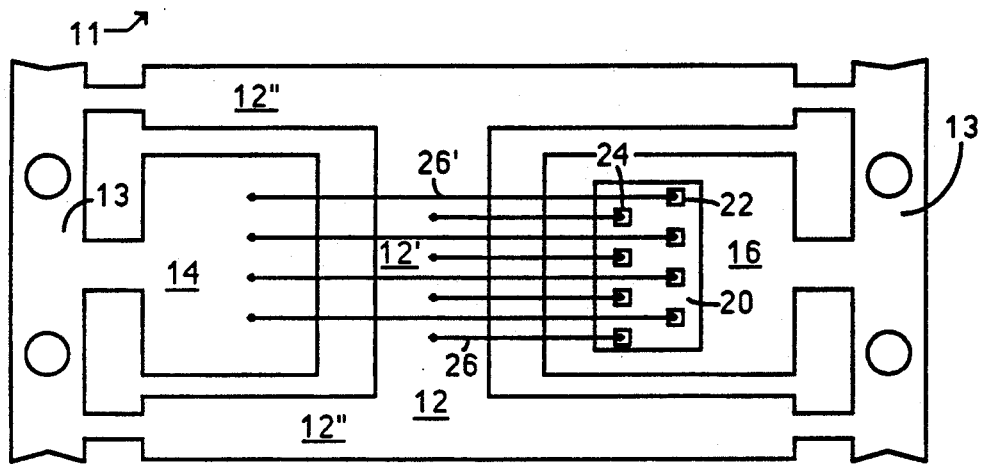
FIG. 2 is a simplified plan view of a leadframe with lead planes, a transistor die and wire bonds, such as is incorporated in FIG. 1.

Although the common emitter configuration is illustrated in FIGS. 1, 2 and 3, it should be understood that the present invention is not limited to this configuration and is also useful in a common base configuration. In such common base configuration, base regions 22 are connected to bridge portion 12' of common lead plane 12, and emitter regions 24 are connected to input lead planes 14. In either configuration, collector lead plane 16 would provide the electrical terminal of the collector of the transistor and the principal thermal dissipation heat path. The lead arrangement of device 10 is easily modified to accept a top-side collector die in which case bonding wires or equivalent would be used for coupling the top collector contact to lead plane 16. Further, while it is convenient to connect bonding wires 26 to bridge portion 12' of common lead plane 12, this is not essential and wires 26 may extend to side portions 12" of lead plane 12.

Where a two-terminal element (e.g. a diode) is desirable to be used as die 20, then it would be mounted on the lead plane intended to serve as the principal thermal dissipation leas (e.g. lead plane 16), and wire bonded, for example, to an input lead plane (e.g. 12 and/or 14). Either or both of lead plane 12, 14 may be as the input lead plane or they may be combined.

Device 10 further comprises body or encapsulation 28 which provides primary structural support for device 10 and its interior parts, and protects the interior parts from the ambient atmosphere and from mechanical damage. Body 28 is preferably made of a moldable compound, for example, a thermo-setting plastic, formed by conventional molding techniques, such as injection molding. Body 28 desirably encapsulates bonding wires 26,26' die 20 and the upper surfaces of lead planes 12, 14 and 16. However, the lower surfaces of lead planes 12, 14 and 16 are exposed to allow electrical connection to the device. Portions of the lateral edges of leads 12, 14, 16 may or may not be exposed. Either arrangement works. Particular features of device 10, according to the present invention, are that it is capable of being tested prior to mounting onto a printing board circuit and that it is well adapted for handing by automatic machinery because it is free from the flying leads that protrude a significant distance from the package and which FIG. 3A illustrates a cross-sectional view of device 10 and its mating printed circuit board 30. Printed circuit board 30 is preferably composed of an epoxy glass insulating base material with electrical connection patterns formed on its upper and/or lower surface. Such circuit boards are well known in the art.

The insulating base material may be considered to be made up of three portions, that is, common portion 32, input portion 33 and output portion 36. On these portions there are respectively provided common contact 34, input contact 44 and output contact 46, so positioned as to mate with common lead plane 12, input lead plane 14 and a portion of collector lead plane 16, respectively, when package 10 is mounted on board 30. Contacts 34, 44 and 46 are typically made of a thin electrically conductive material, such as copper foil or gold plated copper foil and are separated from each other like islands. The contact configuration may be varied according to the connections. FIG. 4 illustrates another contact configuration of printed circuit board 30 and FIGS. 6A–8A illustrate alternative lead plane and transistor configurations. Printed circuit board 30 is usually fixed on another heat sink structure, such as chassis 42, as shown in FIG. 3A.

In a first embodiment, recess portion 38 is provided between common portion 32 and output portion 36, extending through the insulating base material. Electrically insulating and thermally conducting heat sink plate 40 having a flat upper surface is inserted into recess portion 38 so as to mate with lead plane 16, preferably just under transistor die 20, when device 10 is mounted on board 30.

Heat sink plate 40 contains an electrically insulating but thermally conductive material, preferably a highly thermally conductive ceramic such as $Al_2O_3$ or BeO. This provides electrical insulation while allowing thermal conduction to extract the heat dissipated during operation of transistor die 20. Although heat sink plate 40 preferably contains alumina or beryllium oxide, other suitable thermally conductive but electrically insulating materials could be used.

Figure 3B:
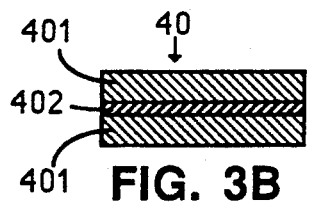
FIGS. 3B-D are simplified cross-sectional drawings of alternative heat sink insulators that can be utilized in FIG. 3A.
Figure 3C:
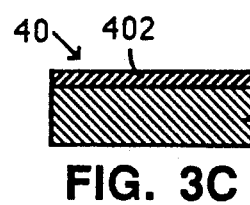
Figure 3D:
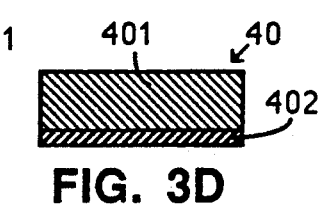

Heat sink plate 40 may be homogeneous, as shown for example in FIG. 3A or be laminated, as shown for example in FIGS. 3B–D. In FIGS. 3B–D, heat sink plate 40 comprises highly thermally conductive metal regions 401 and electrically insulating but thermally conductive region 402. Other combinations may also be used. Because heat sink plate 40 may be formed using only very thin ceramic, e.g., 1–5 mils as opposed to 20–40 mils for the typical in-package isolators, the cost for such expensive ceramic materials can be reduced. Further, assembly of heat sink plate 40 on board 30 is much less critical than placing an equivalent electrical isolation element under the semiconductor die within the prior art packages.

The upper surface of contacts 34, 44 and 46 and heat sink plate 40 may be coated with a metal adapted to permit the lower surfaces of lead planes 12, 14 and 16 to be well bonded to contacts 32, 34 and 36 and heat sink plate 40 with a suitable solder or other electrical connection means. Contacts 34, 44 and 46 are desirably a of a highly electrically conductive metal, such copper, gold or gold plated copper so as to provide a low inductance. This is important where RF operation is desired.

Instead of forming recess portion 38 for receiving heat sink plate 40, metal region 40' may be provided on the upper surface of board 30 between common contact 34 and output contact 46 as shown in FIG. 5. In this situation, the dielectric material of board 30 serves as the thermal conductor to remove heat from lead plane 16 under die 20. This method is usually thermally less effective because most common board materials (e.g.( glass loaded plastics) have lower thermal conductivity than ceramics such as BeO or alumina. However, the cost is substantially lower because the expensive ceramic plate is eliminated and heat transfer is still better than would be obtained without the PC board under lead 16.

Device 10 is desirably mounted on printed circuit board 30 so that heat sink plate 40, 40' is located immediately beneath transistor die 20. Heat sink plate 40, 40' should have as large an area as is practical without interfering with leads 12 and 16 since this decreases the thermal impedance.

Referring to FIG. 3A, when device 10 and board 30 are combined, the lower surfaces of lead planes 12, 14, 16 are substantially coplanar with the upper surface of the leads and heat-sink region on printed circuit board 30. That is, common, input and collector lead planes 12, 14 and 16 are in electrical contact with contacts 34, 44 and 46 respectively, and lead plane 16 is also in thermal contact with heat sink plate 40. It is desirable that lower surface 11 of package encapsulation 28 be recessed slightly (e.g., 0.5-5 mils) from the lower surface of lead planes 12, 14, 16 so as to insure that no part of encapsulation 28 interferes with contact between lead planes 12, 14, 16 and board contacts 44, 34, 40 and 46.

Because the principal heat dissipating electrode of die 20 is separated from heat sink plate 40 in printed circuit board 30 only by metallic lead 40 (and any joining solder materials) and heat sink plate 40 is well coupled thermally to heat sink 42, a very low impedance heat dissipation path is obtained. Also, since lead 16 and heat sink plate 40 can have a larger area than die 20, substantial heat spreading can occur, further reducing the thermal impedance.

Advantages of the present invention are that (i) collector lead plane 16 serves as the support for die 20, as the electrical connector to the lower face of die 20 and as a heat path to provide excellent heat dissipation from die 20 to heat sink 42, (ii) very short wires 26, 26' may be used for connecting device regions on die 20 (or other components) to lead planes 12, 14, and (iii) device 10 mounts directly onto contacts 34, 44, 46 and heat sink plate 40. As a consequence, the parasitic resistance and inductance and the thermal impedance are minimized. These features are extremely useful, especially in RF applications. Accordingly this invention provides an electronic device wherein a transistor or IC or other component or combination thereof can operate at radio frequencies at high powers with the achievement of high gains at high efficiencies and good stability.

FIGS. 6A-8A show plan views in simplified form analogous to FIG. 2, but of alternative lead arrangements. FIGS. 6B-8B show simplified central cross-sections of the lead plane arrangements of FIGS. 6A-8A viewed from the right side thereof and analogous to the cross-section of device 10 shown in the upper portion of FIG. 3A but with encapsulation 28 shown by the dashed lines. In FIGS. 6A-8A, the letters G, E, C and B designate which of the lead planes is coupled to the ground (common), emitter, collector and base terminals of the die, respectively. As those of skill in the art will appreciate based on the description herein, this is merely for ease of explanation and not intended to be limiting.

FIGS. 6A-6B shows an arrangement similar to that in FIGS. 2-3A but with the addition of MOSCAP 52, i.e. an MOS device serving as a capacitor. Bonding wires 54, 56, 58 interconnect die 20, MOSCAP 52 and lead planes 12, 14. MOSCAP 52 typically has one electrode directly connected to lead plane 12, as illustrated.

FIGS. 7A-B shows another arrangement in which common or ground lead plane 12 has bridge portion 62 extending over collector lead 16 so as to permit a double bonded, grounded emitter configuration.

FIGS. 8A—8B show a further arrangement in which a yoke-shaped collector and emitter are provided with double bonded emitters and additional components 70, e.g., resistors, inductors and/or capacitors. While components 70 are indicated as being all alike, those of skill in the art will appreciate that there may be different components or values in different locations. By varying the connections between lead planes 12, 14, 16 and die 20, MOSCAP 52 and components 70, many different electrical circuits can be provided within device 10.

Where a two-terminal element (e.g. a diode) is desirable to be used as die 20, then it would be mounted on the lead plane intended to serve as the principal thermal dissipation leas (e.g. lead plane 16), and wire bonded, for example, to an input lead plane (e.g. 12 and/or 14). Either or both of lead plane 12, 14 may be as the input lead plane or they may be combined.

Electronic device 10 of the present invention is conveniently formed by a method comprising, providing first lead planes 12 of an electrically conductive material (e.g., copper) having opposed first and second surfaces, providing second lead plane 16 of an electrically conductive material (e.g., copper) having opposed first and second surfaces, providing semiconductor die 20 including a first surface having at least one device region therein and a second surface opposite the first surface, attaching the second surface of the semiconductor die to the first surface of second lead plane 16 without an intervening insulator, connecting the at least one device region to the first surface of first lead plane 12 (e.g., by wire 26), and encapsulating device 10 so that at least portions of the second surfaces of lead planes 12, 16 are exposed on a first face of the encapsulation. The second faces of lead planes 12, 16 are exposed. Their edges (e.g., see FIG. 1) may also be exposed.

It is desirable that the foregoing steps provide exposed second surfaces of lead planes 12, 16 that are substantially flat and coplanar. It is further desirable that the encapsulating step provide an encapsulation body that is recessed slightly from the exposed second surfaces of the lead planes. It is further desirable that lead planes 12, 14 form part of a planar "ladder" lead-frame having supporting side-rails 13 which are sheared off after encapsulation.

An electronic assembly having a surface mounting device and a printed circuit board for receiving the device thereon, is formed by the method comprising:

(A) providing surface mounting device 10 comprising, first lead plane 12 of an electrically conductive material having opposed first and second surfaces, second lead plane 16 of an electrically conductive material having opposed first and second surfaces, semiconductor die 20 including a first surface having at least one device region therein and a second surface opposite the first surface, wherein the second surface of semiconductor die 20 is coupled to the first surface of the second lead plane without an intervening insulator, connecting means 26 for electrically coupling the at least one device region to the first surface of first lead plane 12, and encapsulation body 28 for providing structural support for device 10, wherein body 28 covers connecting means 26, semiconductor die 20, and the first surfaces of lead planes 12, 16, and wherein at least parts of the second surfaces of lead planes 12, 16 are exposed on a first face of body 28 (e.g., surface 11 of device 10); and (B) providing printed circuit board 30 comprising, a board member made of an electrically insulating material and having a major surface, first contact 34 of an electrically conductive material and positioned on the surface of the board member so as to mate with at least part of the exposed second surface of the first lead plane 12, second contact 46 of an electrically conductive material and positioned on the surface of the board member so as to mate with at least a first part of the exposed second surface of the second lead plane 16, thermally conductive region 40 extending through the board member and positioned to mate with at least a second part of the exposed second surface of the second lead plane 16 different than the first part thereof, and (C) mounting device 10 on printed circuit board 30 with the second surfaces of first and second lead planes 12, 16 at least partially contacting first and the second contacts 34, 46, respectively, and the second surface of second lead plane 16 at least partially contacting thermally conductive region 40.

It is desirable that thermally conductive region 40 be of a material different than circuit board 30, e.g., of a more thermally conductive material than the insulating base material of circuit board 30, and that it extend through circuit board 30.

ADVANTAGES

According to the present invention, the cost of the surface mounting packages can be remarkably reduced, because the costly metallized ceramic insulator commonly placed between the semiconductor die and the leadframe in prior art packages is no longer required. Even if the same costly ceramic insulator is used as the heat sink plate in the PC board, there is a substantial material saving associated with those encapsulated semiconductor devices that fail final test and are discarded since there is no need to discard the costly ceramic along with the defective device.

Further, the heat sink material which is now incorporated in the printed circuit board, can be made thinner (1-5 mils versus 20-40 mils) and does not require intricate processes such as metallization or brazing. Therefore, the total cost for assembling the electrical circuit including the package and the printed circuit board can be also reduced.

The manufacture of the invented device can be easily automated because a convenient flat "ladder" strip type leadframe may be used. Low cost plastic encapsulation of ladder leadframes and components thereon is well known in the art.

Once manufacturing is completed, the lack of flying leads makes the finished device particularly easy to handle. Bent and damaged leads are avoided since only flat faces of the leads are exposed on package surface 11 and they are held firmly in place by body 28. There are no protruding gull-wing or "J" leads or other types of flying leads to be bent. These features combine to make the invented device particularly convenient for surface mounting on PC boards using automated pick and place equipment.

A further feature of the present invention is that the various lead planes which support the internal die and wires and provide for external connection to the package are held together by encapsulation 28. Thus, a separate supporting substrate is not needed as a part of the device package.

Further, the arrangement provides great flexibility of device and package design so that not only can surface mount devices be constructed according the principles of the present invention, but more conventional parts can also be realized. For example, where the invented device is desired to provide a drop-in replacement for a prior art flying lead device, it may be readily converted to a flying lead device by attaching flying leads to exposed lead planes 12, 14, 16.

While the present invention has been shown and described with reference to particular embodiments thereof, various additional modifications and changes will be apparent to those skilled in the art, based on the description herein. For example, while the invented device has been described as employing bipolar transistors, those of skill in the art will understand that any component having two or more terminals may be employed as die 20 and that the present invention is not limited to three terminal devices. Accordingly, it is intended to include within the scope of the claims that follow these and such other variations as will occur to those of skill in the art based on the description herein.

I claim:

1. A surface mountable semiconductor device having low impedance planar contacts, comprising:

electrically conductive leads having first, second and third spaced-apart portions with gaps therebetween and with exposed, coplanar lower surfaces and opposed upper surfaces, wherein the first, second and third portions are arranged in spaced-apart substantially flat relationship;

at least one high frequency transistor die having its lower face bonded to the upper surface of the first portion and regions on its upper face coupled to the upper surfaces of the second and third portions by electrical connections; and an insulative encapsulation having an upper surface spaced apart from the upper face of the die, a lower surface adjacent the exposed, coplanar lower surfaces of the leads and a side therebetween, surrounding the at least one transistor die and electrical connections, wherein the lower surface of the encapsulation does not extend beyond the coplanar lower surfaces of the first, second and third portions of the leads which are exposed from the lower surface of the encapsulation for providing large area, planar, electrical and thermal contacts to the device.

2. The device of claim 1 wherein the first, second and third portions of the leads do not protrude substantially beyond the side of the encapsulation.

3. The device of claim 1 wherein the lower face of the transistor die is separated from the upper surface of the first portion of the leads by an electrically insulating region.

4. The device of claim 1 wherein an MOS capacitor is mounted on the first surface of at least one of the second and third portions of the leads and forming part of the electrical connection thereto from the transistor die.

5. The device of claim 1 wherein an inductor, resistor or capacitor is bonded to the first surfaces of at least two of the first, second and third portions of the leads and extending therebetween within the encapsulation.

6. A surface mountable semiconductor device, comprising:

electrically conductive leads of sufficient stiffness to be self supporting and having at least first and second spaced-apart portions with gaps therebetween and with exposed, coplanar lower surfaces and opposed upper surfaces;

at least one radio frequency semiconductor die having its lower face bonded to the upper surface of the first portion and at least one region on its upper face coupled to the upper surface of the second portion by at least one electrical connection; and an insulating encapsulation having an upper surface, a lower surface and a side therebetween, surrounding the at least one semiconductor die and electrical connection, wherein the lower surface of the encapsulation does not extend beyond the coplanar lower surfaces of the at least first and second portions of the leads which are exposed on the lower surface of the encapsulation for providing the principal electrical and thermal connections to the device.

7. The device of claim 6 wherein the side of the encapsulation defines an exterior perimeter of the encapsulation and wherein the leads have sides extending between the upper and lower faces of the lead which define an exterior perimeter of the leads and wherein the exterior perimeter of the leads does not extend substantially beyond the exterior perimeter of the encapsulation.

8. A surface mountable electronic device, comprising:
electrically conductive leads having at least first and second portions with opposed first and second principal surfaces, wherein the second surfaces of the first and second portions are coplanar and exposed and form the principal electrical connections of the device;
at least one electronic element having a first face bonded to the first surface of the second portion opposite a first principal electrical connection of the device and another, opposite, face coupled by electrical connection means to the first surface of the first portion opposite a second principal electrical connection of the device; and
molded insulating encapsulation enclosing the electronic element and electrical connection means but not the exposed, coplanar, second surfaces of the first and second portions forming the principal electrical connections of the device.

9. The device of claim 8 wherein the leads have a first lateral perimeter when viewed perpendicular to the coplanar second faces, and the encapsulation has a second lateral perimeter when viewed in the same direction, and the first lateral perimeter does not extend substantially outside the second lateral perimeter.

10. A surface mountable electronic device, comprising:
electrically conductive leads having at least first and second portions with opposed first and second principal surfaces, wherein the second surfaces of the first and second portions are coplanar and exposed;
at least one electronic element having a first face bonded to the first surface of the second portion and another, opposite, face coupled to the first surface of the first portion by electrical connection means; and
molded insulating encapsulation enclosing the electronic element and electrical connection means but not the exposed, coplanar, second surfaces of the first and second portions, wherein the molded insulating encapsulation has a second surface extending between the first and second portions of the leads and recessed from the second surfaces thereof so that the coplanar second surfaces of the first and second portions of the leads protrude slightly from the molded encapsulation.

11. The device of claim 10 wherein the coplanar second surfaces of the first and second portions of the leads protrude substantially in a direction perpendicular thereto and not parallel thereto.

12. An electronic assembly comprising a combination of a surface mounting electronic device and a circuit board for receiving the device thereon:
(A) wherein the surface mounting device comprises,
  (i) electrically conductive leads having at least first and second portions with opposed first and second surfaces, wherein the second surfaces of the first and second portions are coplanar, (ii) at least one radio frequency electronic element having a first face bonded to the first surface of the second portion and another, opposite, face coupled to the first surface of the first portion by electrical connection means, and (iii) a molded insulating encapsulation enclosing the electronic element and electrical connection means but not the coplanar second surfaces of the first and second portions, wherein the molded insulating encapsulation has a second surface and wherein the second surfaces of the first and second portions of the leads protrude slightly from the second surface of the molded insulating encapsulation;
(B) wherein the circuit board comprises, an electrically insulating substrate having first and second metal contact regions thereon mating with at least parts of the coplanar second surfaces of the first and second portions of the leads, and a highly thermally conductive contact region extending through the electrically insulating substrate so as to mate with another part of the second portion of the leads located immediately beneath the electronic element; and
(C) wherein the first and second metal contact regions of the circuit board are bonded to the mating parts of the second surfaces of the first and second portions of the leads, and the highly thermally conductive contact region extending through the electrically insulating substrate is located in intimate thermal contact with the mating another part of the second portion of the leads located immediately beneath the electronic element.

13. The apparatus of claim 12 wherein the leads have a first lateral perimeter when viewed perpendicular to the coplanar second faces, and the encapsulation has a second lateral perimeter when viewed in the same direction, and the first lateral perimeter does not extend substantially outside the second lateral perimeter.

14. The assembly of claim 12 wherein the highly thermally conductive contact region is laminated and more thermally conductive than the electrically insulating substrate of the circuit board.

* * * * *